United States Patent
Matsuo et al.

(10) Patent No.: US 7,247,057 B2
(45) Date of Patent: *Jul. 24, 2007

(54) CONNECTOR ASSEMBLY OF CONNECTOR AND TRANSMISSION BOARD

(75) Inventors: Tsutomu Matsuo, Tokyo (JP); Masakazu Nagata, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 17 days.

This patent is subject to a terminal disclaimer.

(21) Appl. No.: 11/440,077

(22) Filed: May 25, 2006

(65) Prior Publication Data

US 2006/0211309 A1   Sep. 21, 2006

Related U.S. Application Data

(62) Division of application No. 10/759,304, filed on Jan. 20, 2004, now Pat. No. 7,112,098.

(30) Foreign Application Priority Data

Mar. 27, 2003  (JP)  .............................. 2003-086863

(51) Int. Cl.
    *H01R 24/00* (2006.01)
(52) U.S. Cl. .................................... 439/660

(58) Field of Classification Search ................ 439/660, 439/701, 680, 607, 79
See application file for complete search history.

(56) References Cited

U.S. PATENT DOCUMENTS

| 4,298,237 A * | 11/1981 | Griffith et al. ................ 439/60 |
| 6,171,115 B1 | 1/2001 | Mickievicz |
| 6,390,857 B1 * | 5/2002 | Pickles et al. .............. 439/680 |
| 6,736,678 B2 * | 5/2004 | Yao ........................... 439/638 |

FOREIGN PATENT DOCUMENTS

| JP | 53-138061 | 12/1978 |
| JP | 3-42669 | 4/1991 |
| JP | 2001-250612 | 9/2004 |

* cited by examiner

*Primary Examiner*—Briggitte R. Hammond
(74) *Attorney, Agent, or Firm*—Takeuchi & Kubotera, LLP (57) ABSTRACT

A transmission board (10) comprises a frame body (30) and a surface board (20) supported by the frame body (30) and having a transmission circuit. The frame body (30) has plugging edges (33, 34) that project from the edges of the surface board (20) for guiding the terminals of mating connectors to connection pads on the surface board (20). The plugging edges have guiding slopes 33A and 33B, and 34A and 34B. At least the plugging edges of the frame body (30) are made of a metal or resin molding.

8 Claims, 8 Drawing Sheets

CONNECTOR ASSEMBLY OF CONNECTOR AND TRANSMISSION BOARD

CROSS-REFERENCE TO RELATED APPLICATIONS

This is a divisional application of the prior application Ser. No. 10/759,304 filed Jan. 20, 2004, now U.S. Pat. No. 7,112,098 allowed.

BACKGROUND OF THE INVENTION

1. Field of the Invention

The present invention relates to a connector assembly consisting of a connector connected to a transmission board.

2. Description of the Related Art

Generally, a transmission board includes a resinous circuit board with transmission circuit or circuits printed on one or both sides thereof and connection pads provided on an edge of the circuit board for connection with a mating connector. Such a transmission board is disclosed in U.S. Pat. No. 6,171,115; FIGS. 1-2. The edge of the circuit board is tapered so as to facilitate connection between the connection pads and the spring contacts of terminals for a mating connector. The tapered edge is made by planomilling.

The above circuit board, however, has the following disadvantages.

First of all, the processing precision of the tapered edge is very low and the processing requires much labor. The circuit board is so thin that it tends to warp and vibrate upon milling, providing a waving tapered edge or asymmetrical tapered edges on both surfaces. That is, the processing precision is so low that a plurality of terminals have different plugging forces and contact pressures. In addition, the precision in the size of the board itself or the positions of connection pads is so low as to produce a difference between the terminals and the connection pads, preventing miniaturization of a multiple pole connector that has multiple connection pads at high density.

In general, the circuit board is reinforced by mixing glass fibers. When the edge of a circuit board is planomilled, glass fibers project at the tapered portion or powder of the glass fiber or resin adheres to the terminal, making poor contact. The rough surface of the tapered portion prevents smooth movement of the terminals, increasing the plugging force of a multiple terminal connector.

Where transmission circuits are provided on both surfaces of a circuit board, the dielectric loss, which is produced by the resin between the transmission circuit, is so high that the electrical characteristics become poor. Especially, this affects the high-speed transmission. It is noted that the relative permittivity of the resin to air is approximately 4.

SUMMARY OF THE INVENTION

Accordingly, it is an object of the invention to provide a transmission board capable of being made with high precision so as to plug to a mating connector smoothly, permitting high density terminal arrangement, and improving the electrical characteristics and a connector assembly that is made up of a connector connected to the transmission board.

According to the first aspect of the invention there is provided a transmission board capable of achieving the above object and, according to the second and third aspect of the invention, there is provided a connector assembly for realizing the above object.

First Aspect of the Invention

The transmission board has a transmission circuit provided on a surface and connection pads provided on an edge thereof for connection with a mating connector. The edge is provided with a guiding slope for facilitate contact of a terminal of the mating connector with the connection pad. According to the invention, the transmission board comprises a frame body and a surface board supported by the frame body and having a transmission circuit on a surface thereof. The frame body is provided with a plugging edge that project from the edge of the surface board for guiding the terminal of the mating connector to the connection pad. The plugging edge has a guiding slope and at least the plugging edge of the frame body is made of a metal or resin molding.

As a result, the plugging edge is made with high precision so that it is possible to make efficiently a number of frame bodies with no or few variations and with smooth surface. The position of the connection pads relative to the frame body becomes accurate which, in turn, makes accurate the positional relation between the transmission board and a mating connector, making it possible to arrange a number of connection pads with high density. In addition, the smooth surface permits the connector terminal to slide with low friction, resulting in the low plugging force.

A pair of surface boards on which corresponding transmission circuits are provided are held by the frame body at a regular interval such that the corresponding transmission circuits are opposed to each other so as to provide a transmission board for a signal pair. It is preferred that the opposed transmission circuits are made so as to have a characteristic impedance of approximately 100 ohms in the differential operation of the pair. The two surface boards cooperate with the frame body to define a hollow space between them that is filled with air or a material having a relative permittivity and a dielectric loss tangent to provide a transmission board having small loss and the improved electrical characteristics. Where a pair of the surface boards are attached to the frame body such that the ground and signal circuits are provided on the outside and inside thereof, respectively, the signal circuit is connected through the surface board to the connection pad that is provided on the outside.

A projecting guide projects from the plugging edge in the plugging direction to enter in the groove of a mating connector before the connector terminal abuts against the plugging edge. Also, it projects from the plugging edge in the vertical direction, forming a ridge portion. Upon, plugging with a mating connector, the projecting guide brings the plugging edge to a regular position prior to the plugging, thereby eliminating forcible plugging and damage to the connection pad. Where the projecting guide is tapered in both the vertical and horizontal directions, insertion into the mating connector is made easy. The ridge portion makes close contact with the corresponding groove of a mating connector so that the position of the transmission circuit is made accurate in the vertical direction, making even the contact pressure on the connection pad. Even if the transmission board is forcibly plugged, only it is tilted at the ridge portion, and no damage is made to other parts. It is preferred that the inside transmission circuit is connected to the connection pad through the surface board at a position relatively close to the edge, thereby eliminating an ad-hoc or stub in the transmission circuit and minimizing the attenuation or transmission loss at high-speed transmission.

An extended contact of a metal may be attached to the connection pad. It is preferred that it is bent in a U-shape at the plugging edge to reach the guiding slope for protecting it. The signal connection pad is positioned relatively closely to the plugging edge and the ground connection pad is apart from the plugging edge but adjacent to the signal connection pad such that the extended portion is aligned with the signal connection pad. As a result, it is sufficient that the ground terminal of a mating connector is made only slightly longer than the signal terminal, thereby minimizing the connector in the plugging direction.

In order to reduce the plugging force, the guiding slopes are made so as to have different sloping angles in correspondence with respective connection pads. Alternatively, the guiding slopes having different sloping angles or the same sloping angle may be offset in the plugging direction. Consequently, the rate of flexure of the individual terminals on the guiding slopes are different, minimizing the plugging force.

It is preferred that the plugging edge is made higher than the surface board on the side adjacent to the surface board so that the connector terminal does not abut against the edge of the connection pad, minimizing the damage thereto. At least one of the projecting guides is made so as to have a cross-section different from those of the other projecting guides, thereby preventing plugging error of the transmission board.

It is preferred that the frame body is provided with a stopper portion to abut against the mating connector at the predetermined plugging position of the transmission board, thereby preventing damage to the transmission board and connector. Also, it is preferred that the frame body is provided with a lock member for preventing separation from the mating connector. Where the frame bodies are provided with a slit into which a linking member is inserted, it is possible to link them with the linking member and connect them to a mating connector at once. In order to determine the relative position of the surface board and the frame body, they are provided with a hole or notch and a boss or projection, respectively, which are deformed under heat and pressure to attach the surface board to the frame body accurately and firmly. The frame body may have a plurality of plugging edges for plugging to connectors in correspondence with the surface board having connection pads arranged along a plurality of edges.

Second Aspect of the Invention

The second aspect of the invention relates to a connector assembly consisting of a plurality of the transmission boards to a connector. It has transmission circuits on a surface thereof, along the edge of which a connection pads are arranged as part of the transmission circuits so that upon connection to the connector, the connection pads are brought into contact with the connector terminals.

According to the second aspect of the invention, the transmission board comprises a frame body and a surface board supported by the frame body and having connection pads arranged along a plurality of edges of the surface board on which transmission circuits are provided. At least the plugging edge of the frame body is made of a metal or resin molding. A connector is plugged to the transmission boards the plugging edge that corresponds to one of the edges, with the other edge ready to connect to another connector.

Third Aspect of the Invention

The third aspect of the invention relates to a connector assembly consists of a plurality of the transmission boards and a connector connected thereto. It has a plurality of transmission circuits on a surface thereof and a plurality of connection pads arranged along the edge of the surface as part of transmission circuits. A guiding slope is provided on the edge to facilitate contact of the connection terminals with the connection pads.

The transmission board comprises a frame body and a surface board supported by the frame body and having transmission circuits thereon. The frame body has a plugging edge along the edge of the transmission board for guiding the connector terminals to the connection pads. The plugging edge is provided with a guiding slope. At least the plugging edge of the frame body is made of a metal or resin molding. A plurality of the surface boards are held by the frame body such that the corresponding transmission circuits are spaced at a regular interval.

Since a plurality of the transmission boards are provided, it is possible to handle pair signals. The guiding slope guides the connector terminals to the transmission boards smoothly. It is preferred that the characteristics impedance of the opposed circuit patterns in differential operation has approximately 100 ohms. The two surface boards cooperate with the frame body to define a space filled with air or a material having a relative permittivity and a dielectric loss tangent lower than those of a glass fiber reinforced epoxy resin to provide a transmission board having small loss and good electrical characteristics. Where the ground and signal circuits are provided as the transmission circuits on the outside and inside of the surface board, respectively, the signal circuits are connected to the connection pads on the outside through the surface board. The two plugging edges are provided along the two edges of a surface board, which are perpendicular to each other, to be plugged to two connectors.

A projecting guide extends from the plugging edge to enter the corresponding groove of a connector before the connector terminal makes contact with the plugging edge to avoid forcible plugging, thereby protecting the connection pad. Also, a lock member is provided to engage with the connector for preventing separation when the connector moves to a predetermined plugging position. The frame body is provided with a slit into which a linking member is inserted so that a plurality of the transmission boards are held at predetermined intervals by the linking member and connected to a connector, making a connector assembly.

DESCRIPTION OF THE PREFERRED EMBODIMENTS

Figure 1:
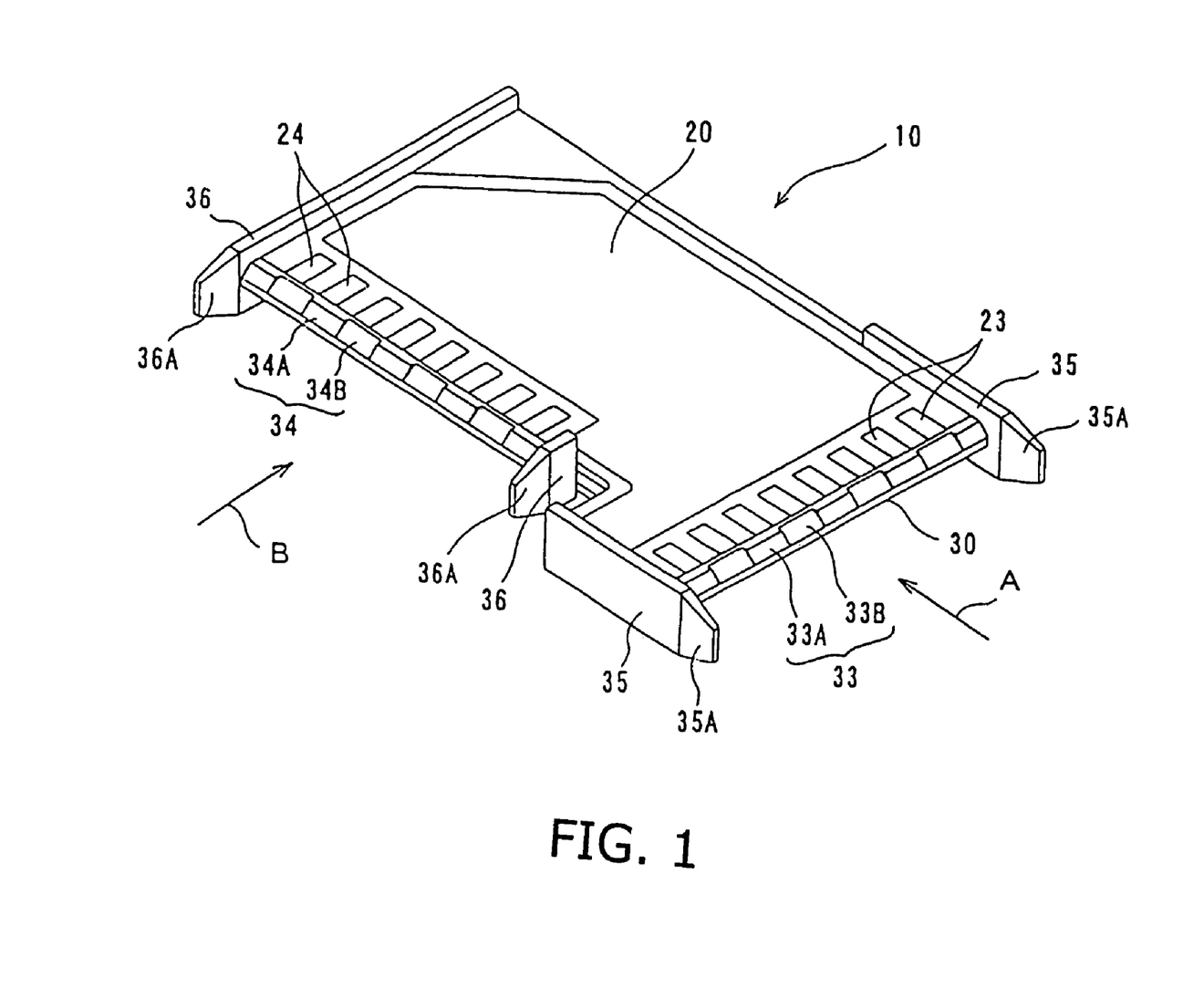
FIG. 1 is a perspective view of a transmission board according to an embodiment of the invention.
Figure 2:
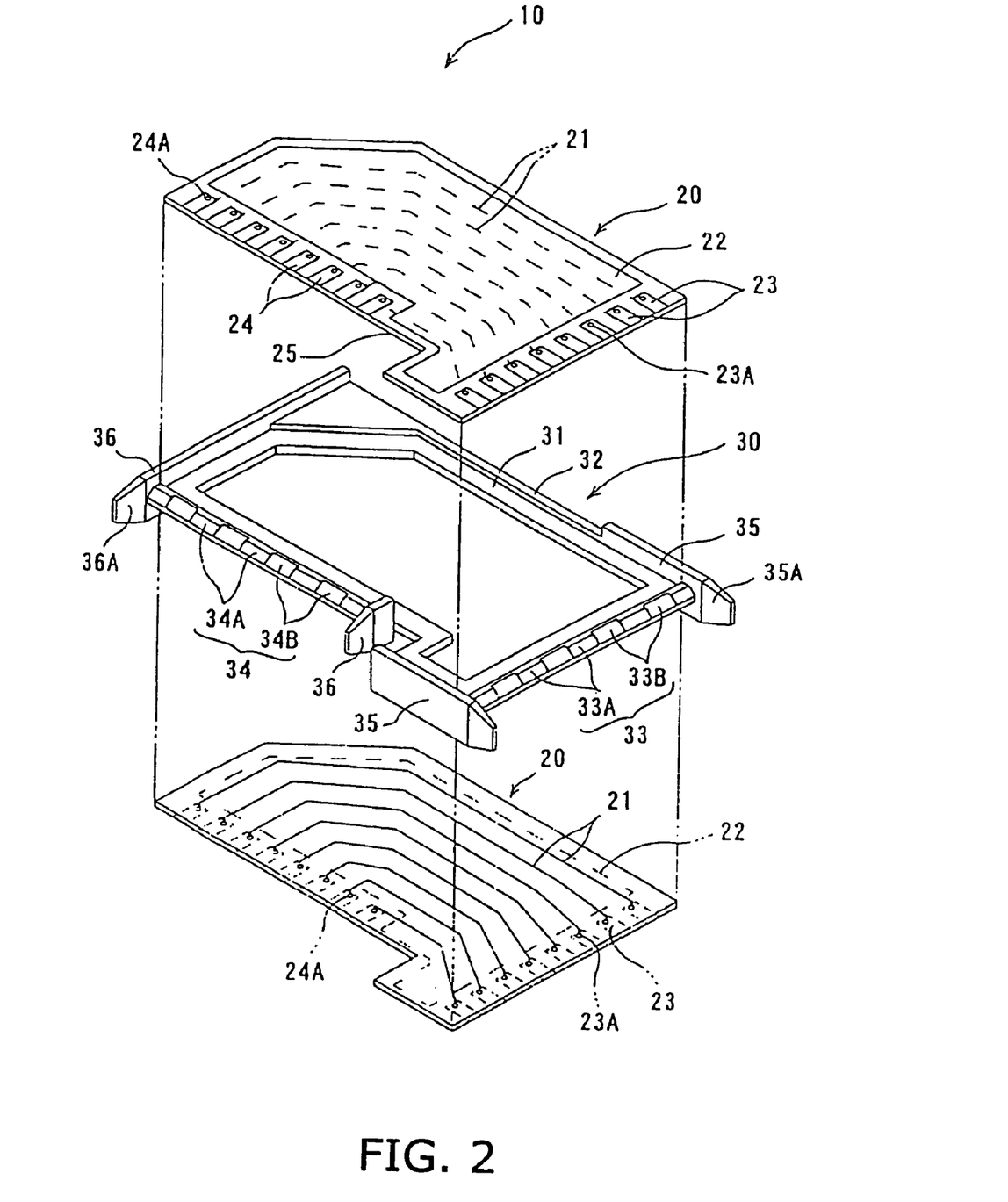
FIG. 2 is an exploded perspective view of the transmission board.

In FIGS. 1 and 2, a transmission board 10 consists of a plurality of surface boards 20 and a frame body 30. The surface boards 20 have an identical circuit and are attached to upper and lower sides of the frame body 30 such that a signal circuit 21 and a shield surface or ground circuit 22 face inside and outside, respectively. Alternatively, the surface boards 20 may have different signal circuits or only a single surface board 20 may be used.

Figure 3A:
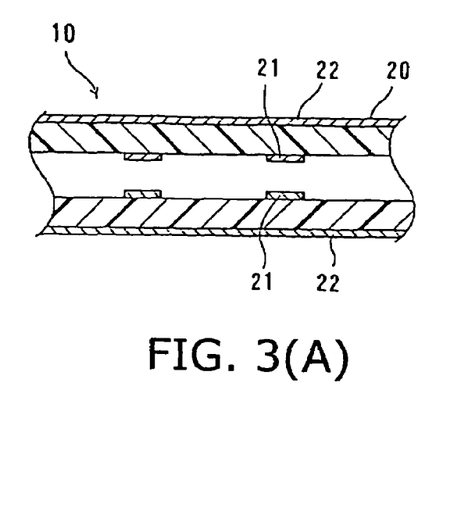
FIG. 3(A) is a sectional view of a hollow part of the transmission board in a plane perpendicular to an arrow A of FIG. 1.

The surface board 20 has a plurality of signal circuits 21 on a surface thereof and the ground circuit 22 on the other surface. The shield surface 22 covers almost all the signal circuits 21. Connection pads 23 and 24 are provided on adjacent two edges of the surface board 20 on the side of the shield face 22. The number of connection pads 23 or 24 is the same as that of the signal circuits 21. In FIG. 2, the connection terminals or pads 23 and 24 are provided at one and the other end of each linear signal circuit 21. A conductive portion 23A or 24A is provided in an aperture of each connection pad 23 or 24 for connecting the connection pad 23 or 24 to a corresponding signal circuit 21 (FIG. 3).

In FIG. 3, since the conductive portion 24A is formed in the same manner, only the conductive portion 23A is shown. A cut-off portion 25 is provided in the surface board 20 such that the two edges on which the connection pads 23 and 24 are provided make a T-shape. The corner between the remaining two edges on which no connection pads are provided is cut off obliquely. A pair of such surface boards 20 are attached to both sides of the frame body 30 such that the two faces on which the signal circuits 21 are provided face inside and are opposed to each other.

The frame body 30 is made by molding a synthetic resin or metal (light metal) into a rectangular frame as shown in FIG. 2. It has a seat face 31 stepped down from a peripheral face 32 by the thickness of the surface board 20 for receiving the edge of the surface board 20. The shape and size of the seat faces 31 are made so that its periphery is substantially identical with the periphery of the surface board 20. It has plugging edges 33 and 34 in correspondence with the edges of the surface boards 20 on which the connection pads are provided. The plugging edges 33 and 34 are tapered so that the spring terminals of a mating connector (not shown) pass over the tapered plugging edges 33 and 34 without difficulty to the connection pads 23 and 24. The plugging edge 33 or 34 has alternately different slopes 33A and 33B or 34A and 34B in correspondence with the connection pads 23 or 24. Alternatively, the plugging edges 33 and 34 may have the same slope.

Projecting guides 35 and 36 are provided at ends of the plugging edges 33 and 34 of the frame body 30. Alternatively, separate projecting guides 35 and 36 may be attached to the frame body 30. They extend in plugging directions perpendicular to the longitudinal directions of the plugging edges 33 and 34 and in the vertical direction. They have a tapered tip 35A or 36A in both the longitudinal and vertical and directions. Upon plugging, they enter the guide grooves of a mating connector to determine the plugging position before engagement with the terminals of the mating connector.

The surface boards 20 are placed on the seat portion 31 at regular positions and secured to the frame body 30 with an appropriate fastener such as an adhesive. The completed transmission board 10 is connected to the mating connector as follows.

In FIG. 1, respective mating connectors (not shown) are plugged to the transmission board 10 at the plugging edges 33 and 34 as shown by arrows A and B. Since the principle of connection is the same, only the connector in the plugging direction A will be described below. The projecting guides 35 enter the corresponding guiding grooves, bringing the transmission board 10 to a predetermined plugging position defined in the vertical and horizontal directions. The tapered tips 35A facilitate the movement into the guiding grooves. The projecting guides 35 determine the plugging position without difficulty and forceful plugging is prevented. Also, a small error in the plugging position is corrected.

Figure 3B:
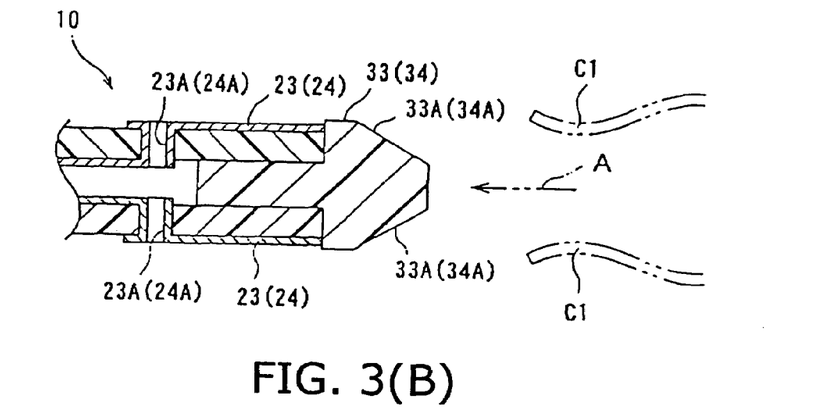
FIGS. 3(B) and (C) are sectional views of the plugging edge of a frame body in planes parallel to the arrow A.
Figure 3C:
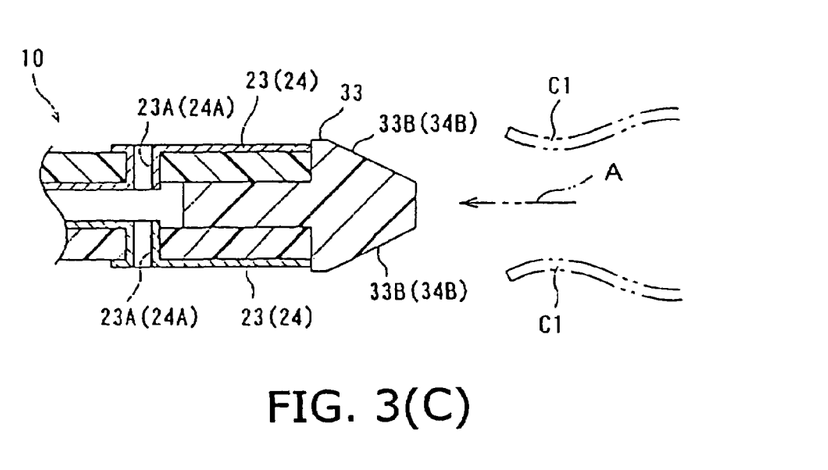

As shown in FIG. 3(B), the connector terminal has a spring contact section C1. When the contact section C1 is moved toward the transmission board 10 in the plugging direction A after the projecting guides 35 enter the guiding grooves of the connector, it slides on and passes over the guiding slopes 33A and 33B while flexing and, then, comes into spring contact with the connection pads 23. Since the connection pad 23 is connected to the signal circuit 21 via the conductive portion 23A, the contact section C1 is connected to the corresponding signal circuit 21.

If the angle of the guiding slope 33B is smaller than that of the guiding slope 33A, the rate of flexing of the contact section C1 on the guiding slope 33B is smaller than that of the guiding slope 33A. Consequently, the plugging force as a whole becomes smaller than that of the connector that all of the terminals are flexed at the rate of guiding slope 33A. In addition, the surface of the contact pad 23 is made lower than the rear ends of the guiding slopes 33A and 33B so that no or little damage is made to the edge of the connection pad 23 because the contact section C1 does not directly ride on the connection pad. The contact section of a ground terminal passes over the edge 33 and comes into contact with the shield face 22 of the transmission board 10 for grounding. Similarly, another connector (not shown) is plugged to the transmission board 10 in the direction B so that both the connectors are connected electrically via the transmission board 10.

The second embodiment of the invention will be described with reference to FIG. 4, wherein both the surface board 20 and the frame body 30 are different from those of the first embodiment.

A plurality of ground connection pads 22A extend from the shield surface at opposite ends of the array of connection pads 23. Consequently, it is sufficient for the ground terminals of a mating connector to be slightly longer than the signal terminals, thereby minimizing the size of the connector in the plugging direction.

The frame body 30 is provided with a pair of stopper portions 35B for bringing the mating connector to a predetermined plugging position, a lock member 37 for preventing separation from the mating connector after plugging, and a slot portion 38 for engagement with a linking member for linking a plurality of transmission boards as a unit.

Figures 4A, 4B:
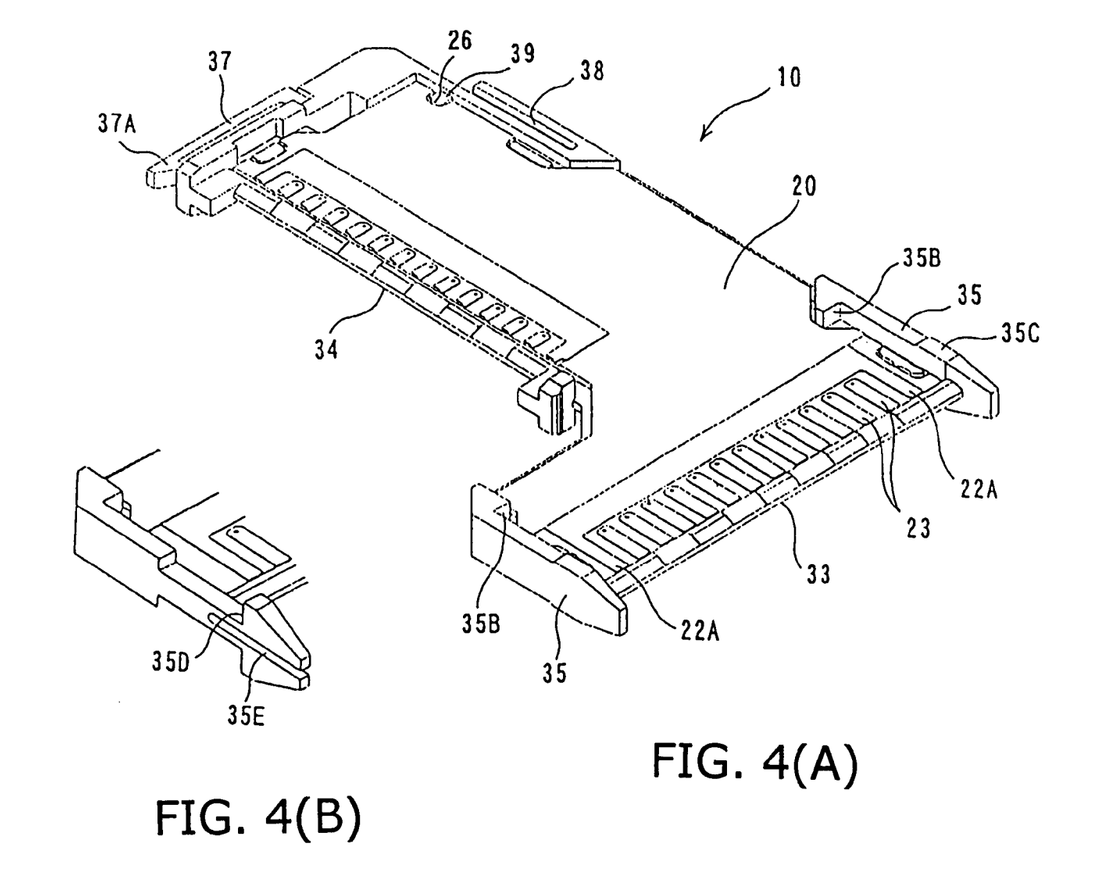
FIG. 4(A) is a perspective view of a transmission board according to the second embodiment of the invention.
FIGS. 4(B) and (C) are perspective views of variations to the second embodiment.
Figure 4C:
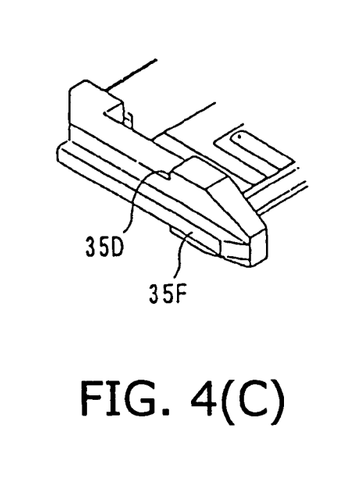

In FIG. 4(A), the stopper sections 35B have a step portion at the plugging edge 33 for abutting on a mating connector to provide the predetermined plugging position. The lock section 37 has a flexible arm with a hook portion 37A for the plugging edge 34. Upon plugging, the hook portion 37A engages with the mating connector for preventing accidental separation.

As shown in FIGS. 4(B) and (C), the lock section 35D is provided on the projecting guides 35 for engagement with a mating connector for preventing separation from the mating connector. In FIG. 4(B), a slit 35E is provided in the projecting guide 35 so that the projecting guide 35 is so flexible that the width of the slit 35E is reduced upon plugging and the compression is released upon completion of the plugging, providing a locking condition. In Fig. (C), such flexing is not made in the projecting guides but in the mating connector. A ridge portion 35F is provided on the side of the projecting guide 35 for preventing erroneous insertion of a transmission board.

Figure 5:
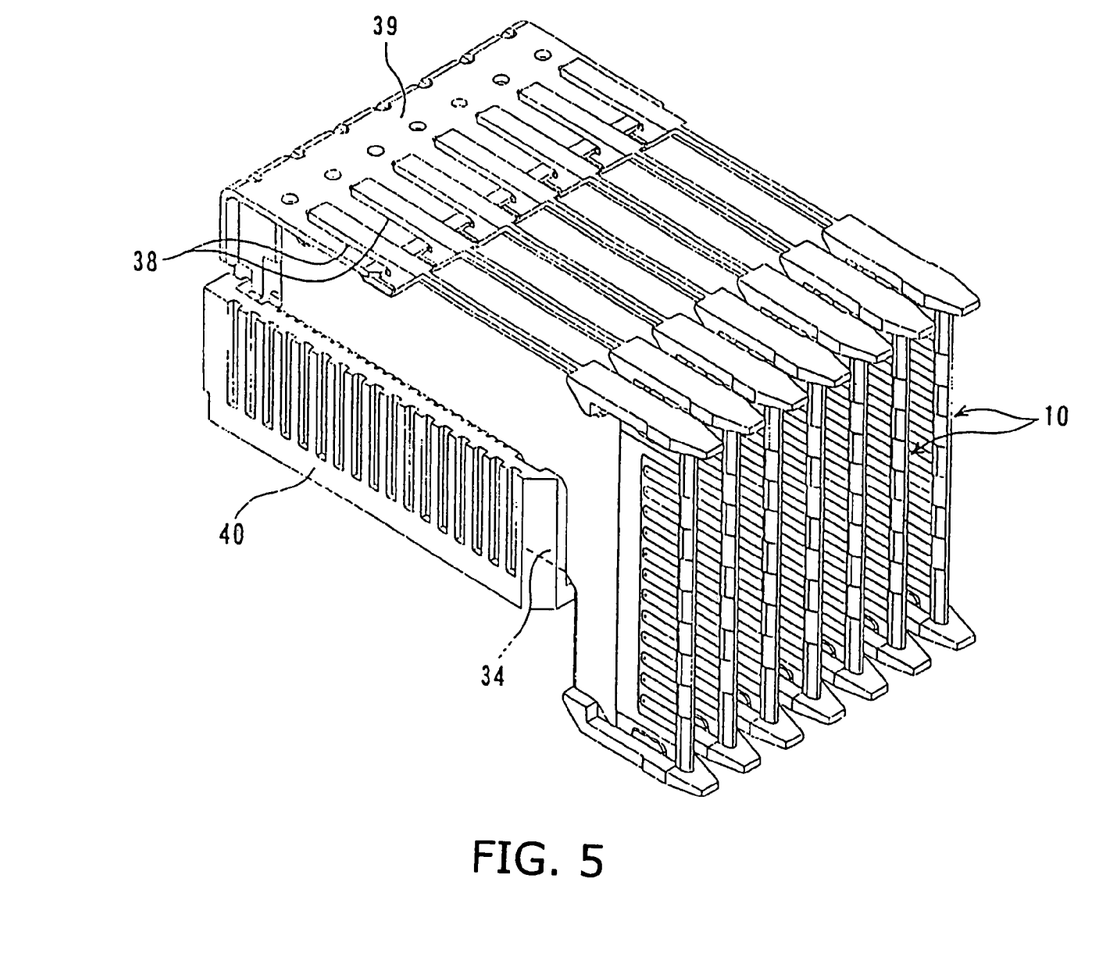
FIG. 5 is a perspective view of a connector assembly.

As shown in FIG. 5, a linking member 39 is inserted into the slot portions 38 provided in the edges opposite to the plugging edges 34 to unite the transmission boards 10 as an assembly. A connector 40 is plugged to the assembly of transmission boards 10 at the plugging edges 34. The linking member 39 is made of a metal in such a shape as to cover the connector assembly for producing shield effects. Alternatively, the adjacent frame bodies may be designed so as to engage with each other, forming an assembly.

Figure 6:
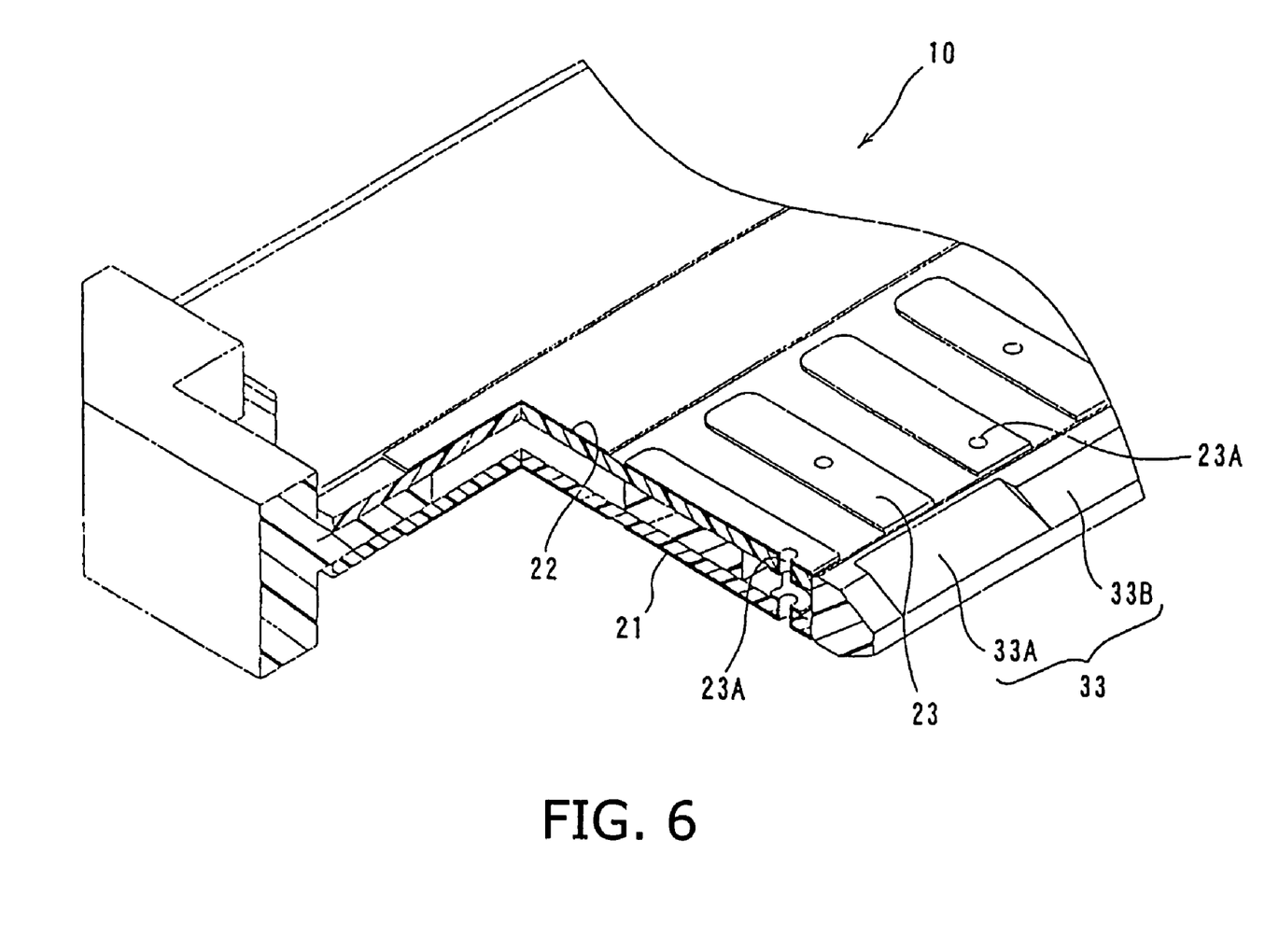
FIG. 6 is a partially cutout, perspective view of the plugging edge of a transmission board according to the third embodiment.

Other embodiments will be described with reference to FIGS. 6 and 7, wherein the plugging force is designed to be minimized. In FIG. 6, as described with reference to FIGS. 1 and 2, two types of guiding slopes 33A and 33B, which have different sloping angles, are arranged alternately. The guiding slopes 33A have a sloping angle smaller than that of the guiding slopes 33B so that the terminals of a mating connector flex on the guiding slope 33A at a lower rate than on the guiding slope 33B. That is, the degree and duration of resistance upon plugging are so different between them that the plugging force as a whole is minimized.

Figure 7:
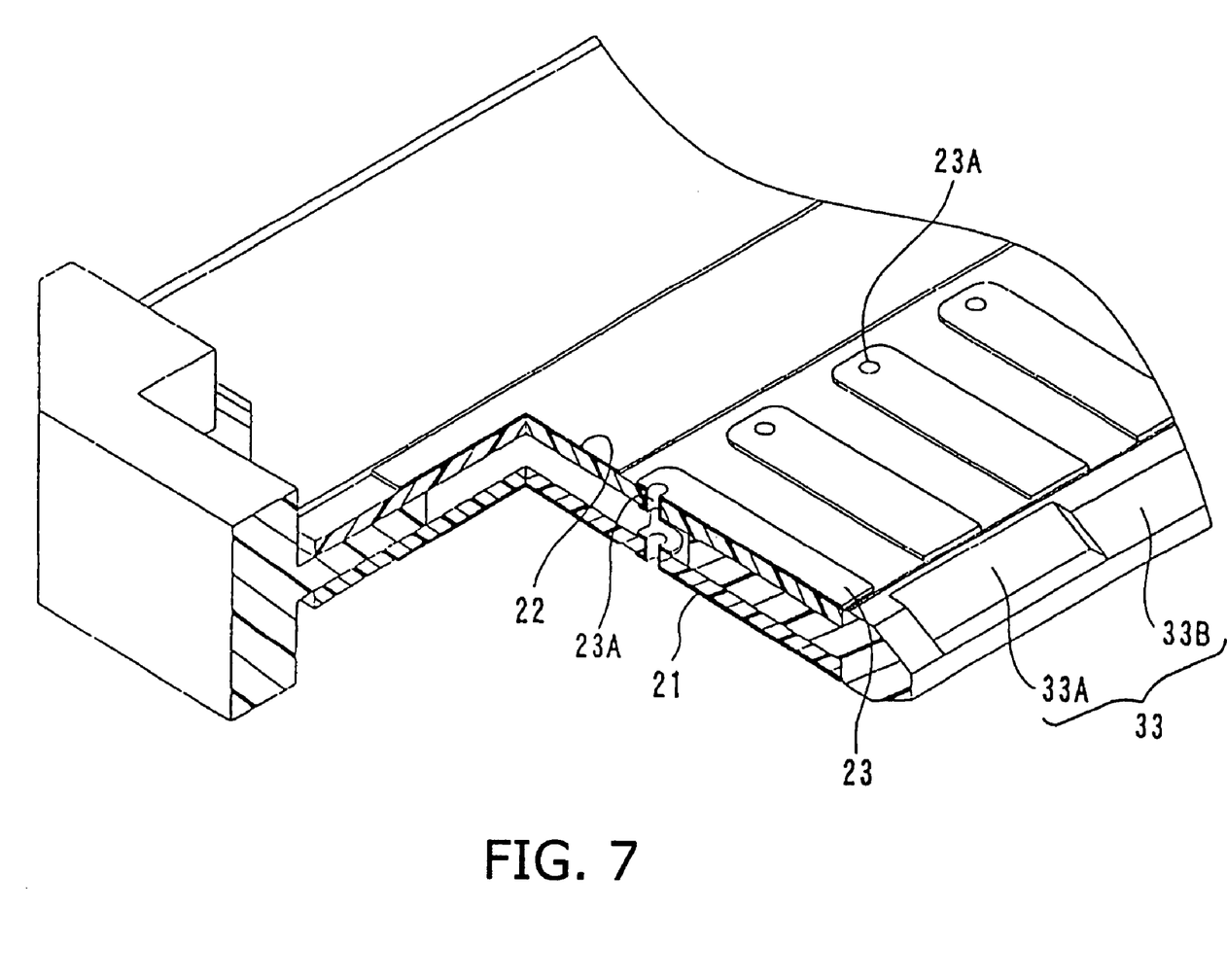
FIG. 7 is a partially cutout, perspective view of the plugging edge of a transmission board according to the fourth embodiment.

In FIG. 7, the guiding slopes 33A and 33B, which have substantially the same sloping angle, are offset in the plugging direction. Consequently, the terminals start to flex at different times so that the respective plugging forces do not concentrate at the same time, minimizing the plugging force as a whole.

The conductive portion 23A is provided relatively closely to the guiding edge 33 in FIG. 6 but spaced farther from the guiding edge 33 in FIG. 7. In the former, there is no ad-hoc or stub (branching) in the transmission circuit, minimizing the attenuation or transmission loss in the high-speed transmission and, in the latter, there is no or little danger that the connector terminal comes to contact with the conductive portion and it is suitable for the application where no high-speed transmission is required.

Figure 8:
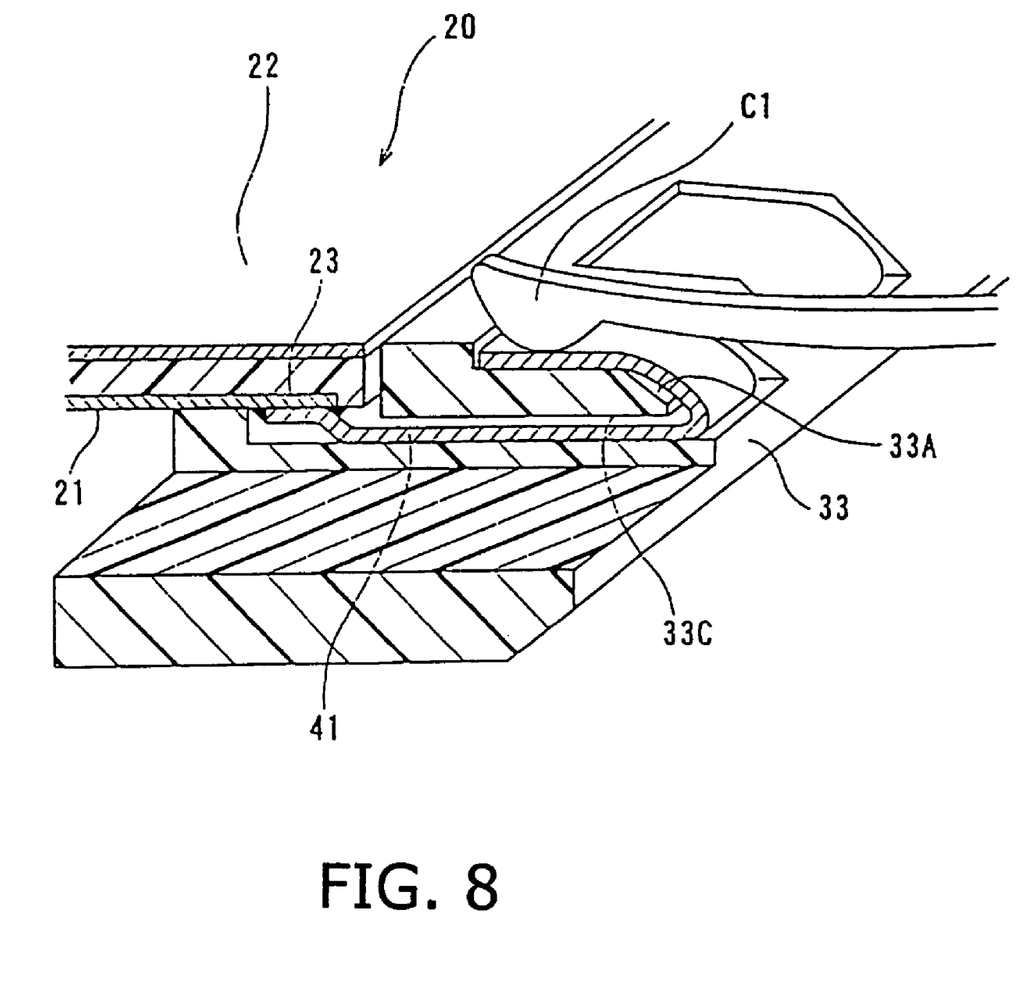
FIG. 8 is a sectional perspective view of the plugging edge of a transmission board according to the fifth embodiment.

In FIG. 8, the connection pad 23 is provided on the lower side of the surface board 20 on which the signal circuit is provided. An extended contact 41 is brazed to the connection pad 23. The extended contact 41 extends outwardly from the edge of the surface board 20 through a slit 33C in the plugging edge 33 of the frame body. It is bent into contact with the guiding slope 33A for protecting the guiding slope 33A. It is brought into contact with the connector terminal C1 at its bent portion, thus eliminating the above stub problem.

A variety of modifications may be made to the illustrated embodiments. For example, if both the signal circuits of two surface boards are made identical and opposed to each other and the characteristic impedance is set at approximately 100 ohms, the electrical characteristics are improved. The mechanical strength and the electrical loss are improved by filling the space between the two surface boards with air or a material having a relative permittivity ($\epsilon r$) and dielectric loss tangent (tan $\delta$) lower than those of the glass fiber reinforced epoxy resin for the surface boards. The glass fiber reinforced epoxy resin "FR-4" has a relative permittivity of 4.8.

As shown in FIG. 4(A), a projection 35C is provided on the top surface of the projecting guide 35 so as to make close contact with the groove in the mating connector so that the vertical position of a transmission circuit becomes accurate, making even the contact pressures on the connection pads of the two surface boards. Ever if the transmission board is plugged forcibly, only it is tilted at the projection 35C and no other parts are damaged. A notch 25 is provided in the surface board 20 and a boss 39 is provided on the frame body 30 for engagement with the notch 25. The boss 39 is then deformed under heat and pressure to secure the notch 26. The plugging edges may be provided on opposite edges or three edges of a transmission board.

As has been described above, according to the invention, the frame body is made of a metal of resin molding so that no mechanical processing such as cutting is required, thus improving not only the productivity but also the accuracy and surface condition of the plugging edge. As a result, not only the contact pressures of connector terminals become even but also the contact positions become so accurate that the plugging operation is made with small sliding resistance. The high precision makes it possible to miniaturize the connection pads and the connector terminal arrangement, providing a compact design.

Where two parallel surface boards are provided on the frame body, a material with a low relative permittivity, such as air, is provided between the surface boards so that the dielectric loss is reduced, thus improving the electrical characteristics. The linking section provided on the frame body makes it easy to provide a connector assembly that has a plurality of transmission boards.

What is claimed is:

1. A connector assembly comprising:
   at least one connector; and
   at least one transmission board connected to said connector, said transmission board comprising:
   a first surface board having at least one first transmission circuit on a first surface thereof and first connection pads on a second surface thereof opposite to the first surface, said first surface board having a first edge portion along which the first connection pads are arranged;
   a second surface board having at least one second transmission circuit on a third surface thereof and second connection pads on a fourth surface thereof opposite to the third surface, said second surface board having a second edge portion along which the second connection pads are arranged; and
   a frame body for supporting the first and second surface boards so that the first transmission circuit is apart from the second transmission circuit by a specific distance according to a specific characteristic impedance when the first transmission circuit and the second transmission circuit are operated in a differential operation, said frame body having one plugging edge attached to the first and second edge portions for covering the first and second edge portions.

2. The connector assembly according to claim 1, wherein said frame body further includes at least one guiding slope.

3. The connector assembly according to claim 1, wherein said first and second circuits have the specific characteristic impedance of approximately 100 ohms in the differential operation.

4. The connector assembly according to claim 1, wherein said first and second surface boards define a space therebetween to be filled with a layer of air or material having a relative permittivity and a dielectric loss tangent lower than those of a glass reinforced epoxy resin.

5. The connector assembly according to claim 1, wherein said first and second transmission circuits include first and second ground circuits on the second and fourth surfaces and first and second signal circuits on the first and third surfaces, respectively, said first and second signal circuits being connected to said first and second connection pads through said first and second surface board.

6. The connector assembly according to claim 1, wherein said frame body is further provided with another plugging edge and said first and second surface boards further include third and fourth edge portions, respectively, said another plugging edge attached to the third and fourth edge portions for covering the third and fourth edge portions.

7. The connector assembly according to claim 1, wherein said frame body is provided with at least one projecting guide projecting from the one plugging edge in a direction that a mating connector is plugged into the connector so that the projecting guide enters a corresponding groove of the mating connector upon plugging before a terminal of the mating connector abuts against said plugging edge.

8. The connector assembly according to claim 1, wherein said frame body is further provided with a slit into which a linking member is inserted to link said transmission board.

* * * * *